United States Patent [19]

Fazlin et al.

[11] Patent Number: 4,859,271

[45] Date of Patent: Aug. 22, 1989

[54] LAMINATION APPARATUS HAVING MULTIPLE BOOK PLATENS

[75] Inventors: Fazal A. Fazlin; Ronald Corces, both of St. Petersburg, Fla.

[73] Assignee: Advanced Plasma Systems, Inc., St. Petersburg, Fla.

[21] Appl. No.: 17,658

[22] Filed: Feb. 24, 1987

Related U.S. Application Data

[63] Continuation-in-part of Ser. No. 723,607, Apr. 15, 1986, Pat. No. 4,681,649, and a continuation-in-part of Ser. No. 832,860, Feb. 24, 1986, Pat. No. 4,689,105.

[51] Int. Cl.[4] ............................................. B32B 31/20
[52] U.S. Cl. .................................... 156/382; 156/285
[58] Field of Search ...................... 100/93 P, 194, 295; 156/285, 286, 323, 382, 583.1

[56] References Cited

U.S. PATENT DOCUMENTS 4,234,373 11/1980 Reavill et al. ...................... 156/382

OTHER PUBLICATIONS

Carter, "Vacuum Presses", PC Fab, Jun. 1986, pp. 65, 66, 70, 71.

*Primary Examiner*—Robert A. Dawson
*Attorney, Agent, or Firm*—Dominik, Stein, Saccocio, Reese, Colitz & Van Der Wall

[57] ABSTRACT

An apparatus for laminating layers of a book composed of printed circuit layers and adhesive layers, the apparatus comprising a press having an upper and lower bolster plate positioned within a vacuum chamber. A platen assembly including a bookshelf and a chamber platen positioned apart from one another is positioned between the upper and lower bolster plates allowing the book to be placed on the bookshelf. Upon actuation of the press, the bookshelf and the chamber platen engage one another to compress the book positioned therebetween. The chamber platen may be heated or cooled.

7 Claims, 11 Drawing Sheets

LAMINATION APPARATUS HAVING MULTIPLE BOOK PLATENS

CROSS REFERENCE TO RELATED APPLICATIONS

This application is a continuation-in-part application of Ser. No. 723,607, filed Apr. 15, 1985, now U.S. Pat. No. 4,681,649, and Ser. No. 832,860, filed Feb. 24, 1986, now U.S. Pat. No. 4,689,105, the disclosure of each of which is hereby incorporated by reference herein.

BACKGROUND OF THE INVENTION

1. Field of the Invention

This invention relates to the manufacture of multi-layer printed circuit boards. More particularly, this invention relates to an apparatus and method for laminating the individual printed circuit boards together to produce a multi-layer printed circuit board.

2. Description of the Background Art

Printed circuit boards comprise a sheet or board of electrically resistive material on which is printed a wiring circuit. Various electrical components such as integrated circuits, discrete components and connectors are then soldered to the wiring circuit via holes drilled through the board. Double-sided printed circuit boards comprise a board having a wiring circuit printed on both sides thereof.

Multi-layer printed circuit boards have been developed which comprise individual single- or double-sided printed circuits electrically insulated from one another. Holes are drilled through the board at planned locations to allow interconnection of one printed circuit with one or more of the printed circuits. Drill smear existing on the edges of the hole of the printed circuit is removed either through a wet etch-back process or by the plasma desmearing process disclosed in U.S. Pat. No. 4,425,210, entitled "Plasma Desmearing Apparatus and Method", the disclosure of which is hereby incorporated by reference herein.

After drill smear is removed, the holes are then plated through to electrically interconnect the individual printed circuits by either electrolytic plating, electroless plating, immersion plating, or plasma plating, as more particularly disclosed in U.S. Pat. No. 4,474,659, entitled "Plated-Through-Hole Apparatus and Method" and the U.S. patent application entitled "Desmearing and Plated-Through-Hole Apparatus and Method", Ser. No. 832,862, filed Feb. 24, 1986, now U.S. Pat. No. 4,806,225, the disclosures of which are hereby incorporated by reference herein. The multi-layer board is now ready to receive the various electrical components via the holes in the board. After inserting the leads of the components into the holes, the components are soldered to the printed circuits, either individually or by wave soldering techniques.

From the foregoing brief description, it is evident that the manufacture of multi-layer printed circuit boards (MPCB) involves many exacting processes in order to produce a structurally and electrically sound MPCB which meets military and civilian specifications. As set forth hereinafter in more detail, one of the many problems associated with the manufacture of MPCBs is the method for laminating the printed circuit boards to meet such specifications. Usually, failure of the MPCB is the result of improper or inadequate lamination of the layers together which results in, in some areas, insecure lamination during the manufacturing process or actual delamination in the field when the board is in use. Consequently, proper lamination is critical to the successful manufacture of MPCBs.

Presently, there exist many variations in the techniques used to successfully laminate MPCBs. One of the most common technique for producing MPCBs is to begin with non-conductive boards which are coated on both sides with copper or similar conductive material. Each side of the double-sided board is then coated with an etch-resistant/photo-resist material. Using a photographic negative of the desired printed circuit, the photo-resist is exposed and developed to remove the photo-resist in all areas except for the lines which will constitute the printed circuit. The board is then etched to remove the copper coating in all areas except for such lines, thereby producing copper lines defining the printed circuit. Of course, the printed circuits formed on each side of the double-sided board have been registered with respect to one another. Usually, registration holes are provided to assure that the printed circuits will be registered when the boards are laminated together.

During the actual step of lamination, the boards are stacked on a platen. An epoxy-impregnated, non-conductive woven material, also known as "B" stage, is placed between each adjacent board and then another platen is placed on top of the sandwiched lamination. The woven material is selected having a certain thickness to assure that the printed circuit on one board is electrically isolated from that of the adjacent board. The bottom platen usually includes registration pins which allow the boards to be registered with respect to one another, thereby also registering the printed circuits.

The sandwiched platens/printed circuit boards/epoxy-impregnated woven material, commonly referred to as a "book", is placed into a heated, hydraulic press. The press is then operated to heat and forcibly compress the book to activate and rapidly cure the epoxy contained with the woven material. After curing the epoxy at the desired temperature and pressure, the book is released from the press and, after cooling, the platens are removed revealing the produced MPCB. After drilling the MPCB, the holes in the MPCB are desmeared and then plated-through by one of the processes discussed above. The MPCB is now ready for receiving the electrical components.

In other variations of the lamination method, the book may comprise inner layers composed of single-sided boards, and/or the adhesive layer may comprise epoxy-glass, acrylic, or the products sold under the trademarks "Polyamide", "Kapton", or "Teflon".

One of the most difficult problems associated with the laminating process is the difficulty of properly heating and compressing the layers of boards and epoxy-impregnated woven material together with assurance that the epoxy will be heated to sufficiently flow and make adhesive contact with all areas of the boards as pressure is simultaneously applied. Specifically, underheating and/or underpressurization may result in some areas never being properly bonded. Conversely, overheating and/or overpressurization will, typically, result in too much of the epoxy being forced out from between the boards and/or overcompression of the woven material. This will produce a thinner, non-conductive layer which does not electrically isolate the printed circuit on one board from that of the adjacent board. Consequently, the desired electrical properties of non-conductance between printed circuits cannot be assured. Further, so much epoxy may have been forced out from between the boards that delamination in the field will occur due to the lack of optimal bonding strength.

Therefore, it is an object of this invention to provide an apparatus and method which overcomes the aforementioned inadequacies of the prior art and provides an improvement which is a significant contribution to the advancement of multi-layer printed circuit board lamination art.

Another object of this invention is to provide a multi-layer printed circuit board lamination apparatus and method which provides for more precise and consistent lamination of printed circuit boards that which can be obtained by previously known methods.

Another object of this invention is to provide a multi-layer printed circuit board lamination apparatus and method which involves the use of a vacuum chamber to assure that the heating and bonding of the epoxy occurs in a vacuum free of contaminants.

Another object of this invention is to provide a multi-layer printed circuit board lamination apparatus and method in which the lamination is carried out in a vacuum and with adequate pressure being applied to the printed circuit board to assure proper thickness and bonding of the epoxy during the process.

Another object of this invention is to provide a multi-layer printed circuit board lamination apparatus and method which can be accomplished with repeatable accuracy to assure production of multi-layer printed circuit boards in production quantities and meeting the highest specifications.

Another object of this invention is to provide a multi-layer printed circuit board lamination apparatus and method which provides for more precise and consistent lamination of printed circuit boards than which can be obtained by previously known methods.

The foregoing has outlined some of the more pertinent objects of the invention. These objects should be construed to be merely illustrative of some of the more prominent features and applications of the intended invention. Many other beneficial results can be attained by applying the disclosed method in a different manner or modifying the apparatus and method within the scope of the disclosure. Accordingly, other objects and a fuller understanding of the invention may be had by referring to the summary of the method and the detailed description of the preferred apparatus and method in addition to the scope of the invention defined by the claims taken in conjunction with the accompanying drawings.

SUMMARY OF THE INVENTION

The invention is defined by the appended claims with a specific embodiment shown in the attached drawings. For the purpose of summarizing the invention, the invention comprises a unique lamination apparatus and method for producing multi-layer printed circuit boards. Basically, the method of the invention comprises positioning layers of double- or single-sided printed circuit boards and B stage (or other adhesive layer) between a pair of platens to form a book, as that term is conventionally used in the printed circuits industry. The book is then positioned between a pair of chamber platens within a vacuum chamber. One or both of the chamber platens are operatively connected to a motive means so as to move toward one another to tighten about the book. A position sensor, either opto-electrical or electro-mechanical, is provided to sense the relative spacing between the two chamber platens. The chamber platens are heated by one or more possible heat sources. All of these functions may either be under manual control or controlled by a state-of-the-art computer.

The steps of the method of the invention comprise, first, forming a book of printed circuit boards and layers, as is conventional in the art, and then placing the book between the chamber platens of the vacuum chamber. The lid of the vacuum chamber is closed and the vacuum pump is operated to evacuate the vacuum chamber. Heat is applied to the chamber platens by one of many possible heat sources and the motive means is operated to move the chamber platens together to a prespecified distance apart from one another, depending on the overall thickness of the book. The position sensor determines the relative positions of the chamber platens. When the chamber plates have been moved to the prespecified distance apart, the chamber platens are held at that position while heat is applied to the layers. After a prespecified time period sufficient to melt and cure the epoxy contained within the B stage (or other adhesive layer), the chamber platens are moved apart as atmospheric pressure is restored within the chamber. The book is removed revealing the newly laminated multi-layer printed circuit board. The process may then be repeated.

One of the most important features of the subject method of the invention is that the lamination is accomplished within a vacuum. In such a vacuum, the great majority of the air which is naturally present between the individual layers of the book is evacuated before the epoxy is activated by the heat. Consequently, all areas of the layers of the book intimately contact one another because of the non-existence of trapped air between such layers. Thus, during activation and curing of the epoxy, a complete bond is assured to be attained between the material and the boards on all surfaces. The weak spots sometimes found in previous lamination methods is, therefore, precluded.

Another significant feature of the method of the invention is the lack of excessive pressure being exerted on the book which would otherwise force out significant amounts of epoxy during the lamination process. More specifically, the method of the invention comprises moving the chamber platens together to a predetermined distance apart from one another, dependent upon the thickness of the book to be laminated. Because of the lack of air between the layers, intimate contact can be assured between the layers of the book when the platens are simply moved to the predetermined, spaced-apart distance. Notably, it becomes unnecessary to continually apply significant pressure on the layers which, as noted earlier, could result in forcing too much epoxy from between the boards such that insufficient bonding is present which will result in delamination in the field.

In one embodiment, the apparatus of the invention comprises a vacuum chamber in which is positioned a pair of chamber platens operatively driven by a hydraulic cylinder. The apparatus may be used to accomplish the method of the invention, as described herein, or other presently known lamination methods.

In another embodiment, the apparatus of the invention comprises a plurality of serially interconnected vacuum chambers preferably including a loading chamber, a press chamber and an unloading chamber. An opening is provided in the common wall of adjacent chambers and each such opening is provided with a remotely operated air-tight door. Another opening is provided in the outside front walls of the loading chamber and the unloading chamber, and each are also provided with an air-tight door. An input transport system is positioned in the loading chamber to transport a printed circuit board book therefrom into the press chamber through the opening in the common wall between loading and press chambers. An output transport system is positioned in the unloading chamber to remove the printed circuit board book from within the press chamber into the unloading chamber via the opening in the common wall between the press and the unloading chambers.

Notably, a vacuum may be created in each chamber independent from the others. Hence, during use on a production line basis, the loading and unloading chambers function to isolate the press chamber from atmospheric pressures, thereby allowing the press chamber to constantly remain at a vacuum free of contaminants. Consequently, the heated press contained within the press chamber can be maintained at a pre-set temperature during each press operation as no significant heat loss will occur from the press chambers as the books are loaded and unloaded into and from the press chamber. Thus, more precise and consistent lamination of the printed circuit boards of the book can be obtained. Further, the throughput of the vacuum press is increased while maintaining the repeatable accuracy in the production of the printed circuit boards of the book.

In still another embodiment, the apparatus of the invention comprises a plurality of platen assemblies positioned between a pair of bolster plates operatively driven by one or more hydraulic cylinders. More particularly, the platen assemblies are positioned in a spaced apart manner from one another allowing sufficient room between adjoining bookshelves to allow the printed circuit board book to be placed thereon via a loading opening in the chamber. Means are provided for each platen assembly to allow the same to be moved upwardly as the lower bolster plate of the hydraulic press moves upwardly. Thus, progressive upward movement of the lower bolster plate of the hydraulic press first engages the lowermost platen assembly to force it upwardly to engage the adjacent second lowest platen assembly. The sequence repeats itself until each platen assembly has engaged the other platen assembly immediately above to produce a sandwich configuration in which the printed circuit board book is sandwiched between adjoining pairs of platen assemblies. After sandwiching at a desired pressure, the platen assemblies are electrically heated to activate and cure the adhesive B stage in each book. Means are also provided to cool each platen assembly to accurately control the curing of the adhesive B stage in the printed circuit board books prior to relieving the pressure exerted by the hydraulic press.

In its preferred embodiment, each platen assembly comprises a bookshelf on which the printed circuit board book is placed and a chamber platen which is heated and cooled to activate and cure the adhesive B stage of the book. Most preferably, means are provided to retain the bookshelf in a spaced-apart manner from its chamber platen of each platen assembly such that heat transfer does not occur between the chamber platen and the bookshelf during loading and unloading of the chamber while allowing each chamber platen to engage against its respective bookshelf during operation of the hydraulic cylinder so that proper pressure is applied to the book while allowing heat transfer between the chamber platen and its bookshelf.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other methods for carrying out the same purposes of the present invention. It should also be realized by those skilled in the art that such equivalent methods do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
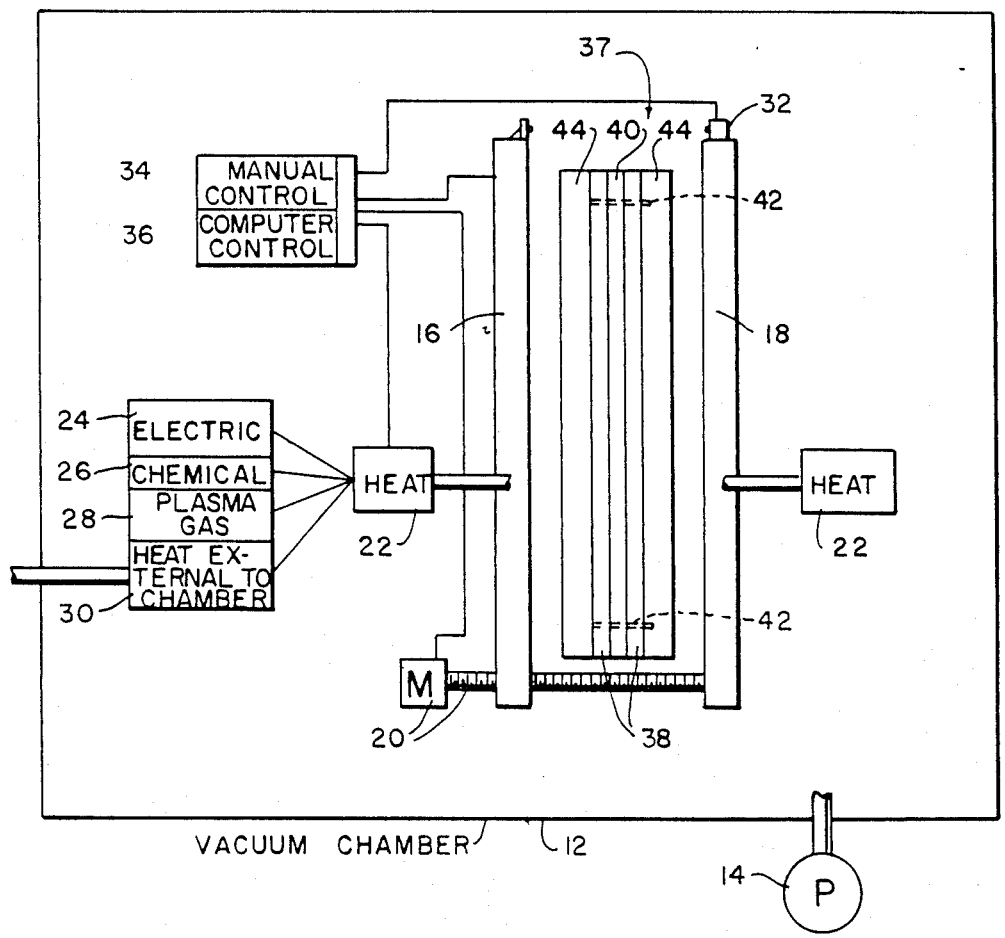
FIG. 1 is a diagrammatical view of the first embodiment of the invention showing the electrical and mechanical components necessary to accomplish the preferred method of the invention.

FIG. 1 illustrates some of the electrical and mechanical components necessary to accomplish the method of the invention. Basically, the method of the invention is conducted within a vacuum chamber 12 of practically any desired shape or configuration and possibly that disclosed in the patents referenced above. A vacuum pump 14 is provided with appropriate valving to evacuate the chamber. Inside the chamber, two chamber platens 16 and 18 are provided, one or both of which is movable with respect to the other by suitable motive means generally indicated by the numeral 20. Both of the chamber platens 16 and 18 are heated by a suitable heat source generally indicated by numeral 22. Without limitation, the heat source 22 may include electrical heating such as resistive elements 24, chemical heating 26, heat produced upon the formation of plasma gas 28 or an external heat source 30 fluidly connected to a heat exchanger incorporated within the chamber platens 16 and 18. The relative spacing of the chamber platens 16 and 18 is constantly monitored by means of a position sensor 32 which may be an electro-optical device or an electro-mechanical device without departing from the spirit and scope of this invention. All of the components may be operated under manual control 34 or by computer control 36.

Figure 2:
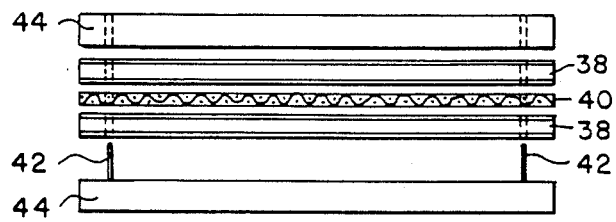
FIG. 2 is a diagrammatical view showing a conventional book composed of double-sided printed circuit boards to be laminated together by means of B stage or other adhesive layers.

FIG. 2 is a diagrammatical view showing a conventional book composed of double-sided printed circuit boards to be laminated together by means of B stage or other adhesive layers. More specifically, conventional books 37 comprise double- or single-sided boards 38 (or layers) which are separated from one another by means of the B stage 40 (or other adhesive layers). The B stage and the other adhesive may comprise any of the presently available materials used in the industry without departing from the spirit and scope of this invention. Moreover, the term "adhesive layer" shall be defined to include all of such materials for the purposes of the claims appended hereto. These layers are placed between a pair of platen assemblies 44 and are registered with respect to one another by means of registration pins 42.

Figure 3:
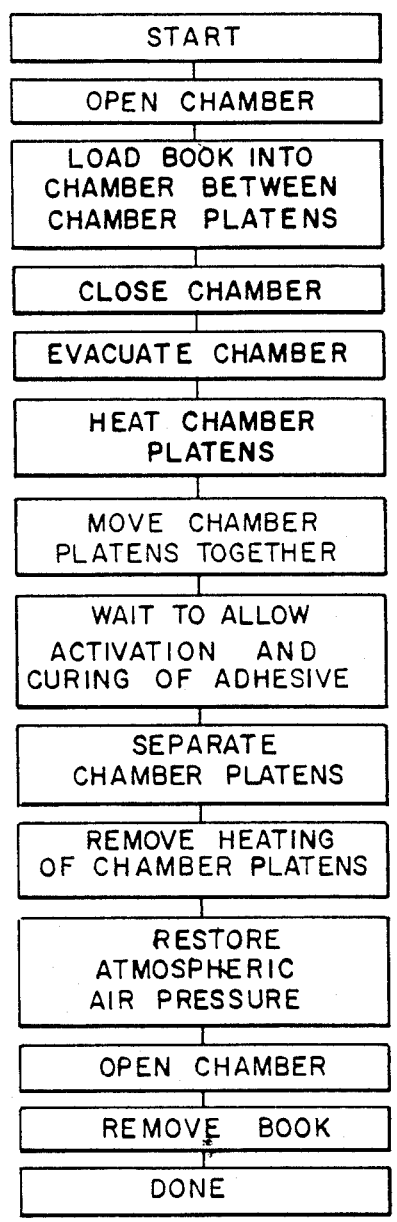
FIG. 3 is a labeled flow chart illustrating the steps of the preferred method of the invention.

Referring to FIG. 3, the method 10 of the invention comprises the steps listed in the flow chart. More particularly, with reference also to FIG. 1, the method of the invention comprises the steps of opening the chamber 12 and then loading the book 37 between the pair of chamber platens 16 and 18.

Once the book 37 is properly loaded into the chamber 12, the lid (not shown) of the chamber 12 is closed and the chamber 12 is evacuated by means of pump 14. The chamber platens 16 and 18 are heated by means of heat source 22 until a desired temperature is attained. In this regard, temperature sensors 46 are provided to accurately sense the actual temperature of the chamber platens 16 and 18. Before, during or after the heating of the chamber platens 16 and 18, the chamber platens 16 and 18 are moved together by motive means 20 until they are a prespecified distance apart. Position sensor 32 is provided to accurately determine such perspecified distance and to feedback such information to computer 36 or to the operator if operated under manual control 34. The prespecified distance is determined according to the thickness of the book 37.

After activation and curing of the epoxy contained within the epoxy-impregnated material (or other adhesive material being used), the chamber platens 16 and 18 are separated by motive means 20. The supply of heat 22 to the chamber platens 16 and 18 is discontinued, and chamber 12 is returned to atmospheric pressure. The chamber 12 is opened and the newly laminated multi-layer printed circuit board is removed. The process is then repeated to produce another laminated multi-layer printed circuit board.

It is noted that, without departing from the spirit and scope of this invention, many MPCBs can be produced at the same time within the chamber by actually producing two or more MPCBs between the pair of chamber platens 16 and 18, by providing additional pairs of platens, and/or by ganging the platens such that one or more MPCBs are produced between adjacent platens.

Figure 4:
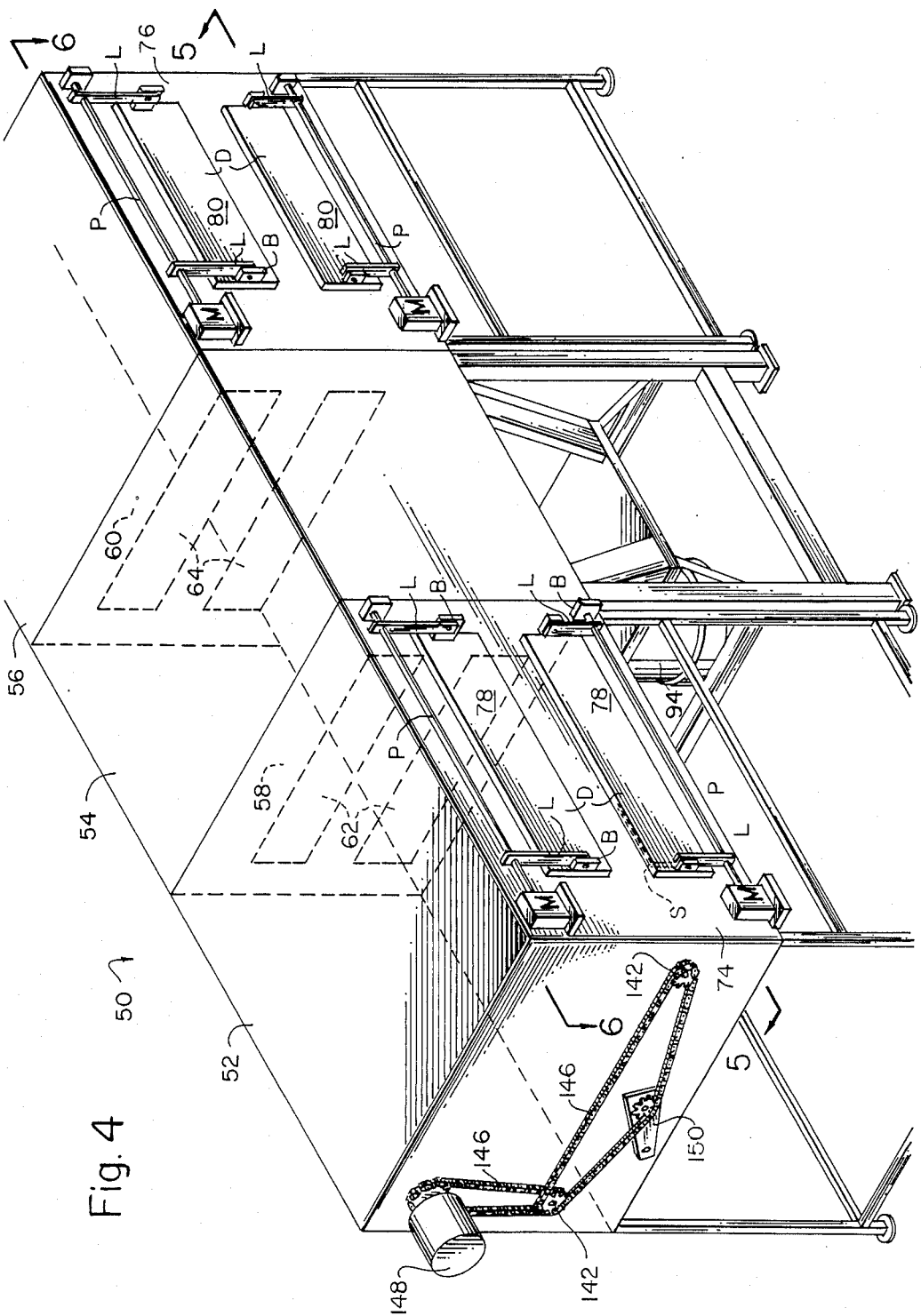
FIG. 4 is a perspective view of the second embodiment of the apparatus of the invention comprising a loading chamber, a press chamber, and an unloading chamber.
Figure 5:
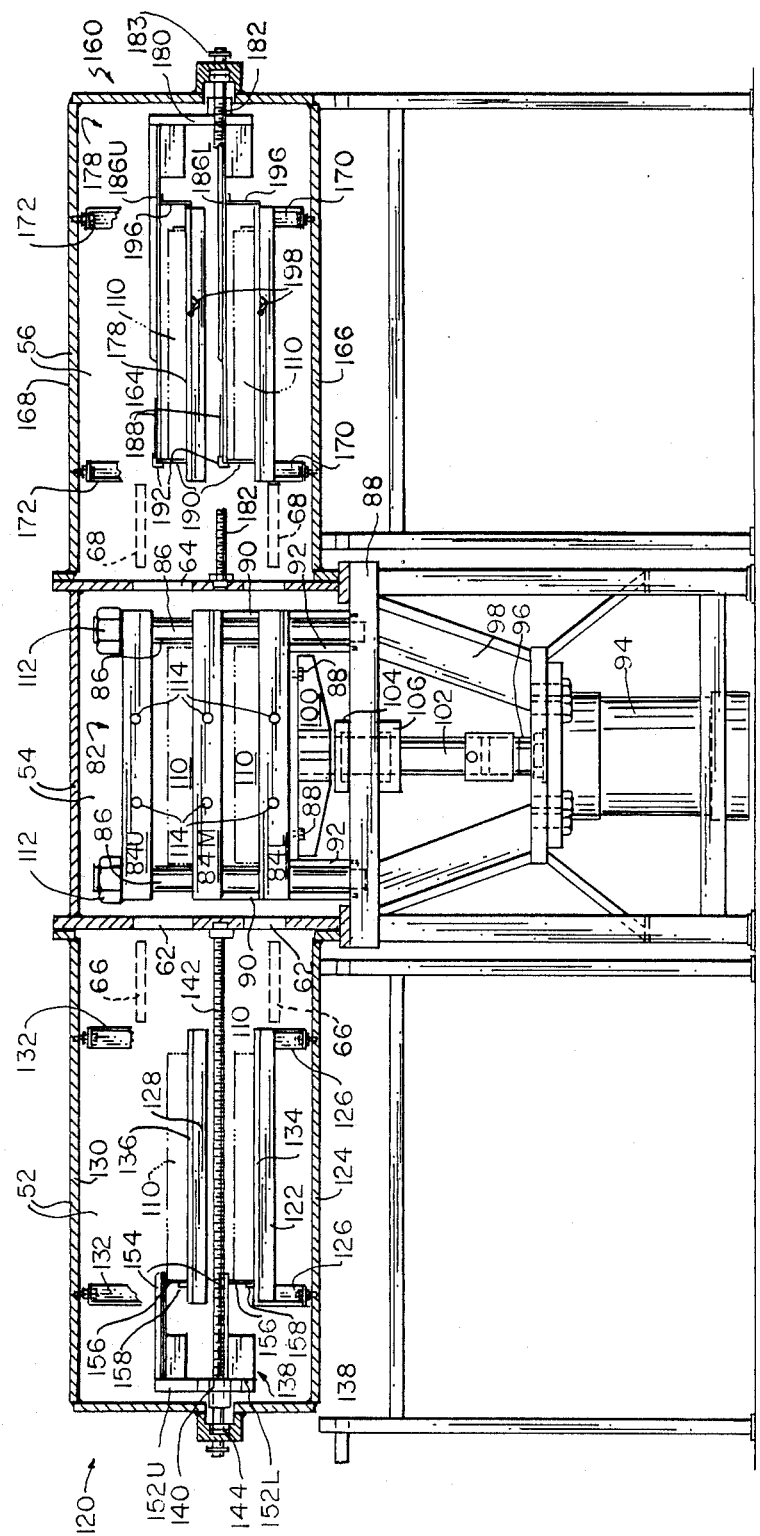
FIG. 5 is an interior front view of the chambers illustrating the transport mechanisms contained in the unloading and loading chambers and the hydraulic press positioned in the press chamber.
Figure 6:
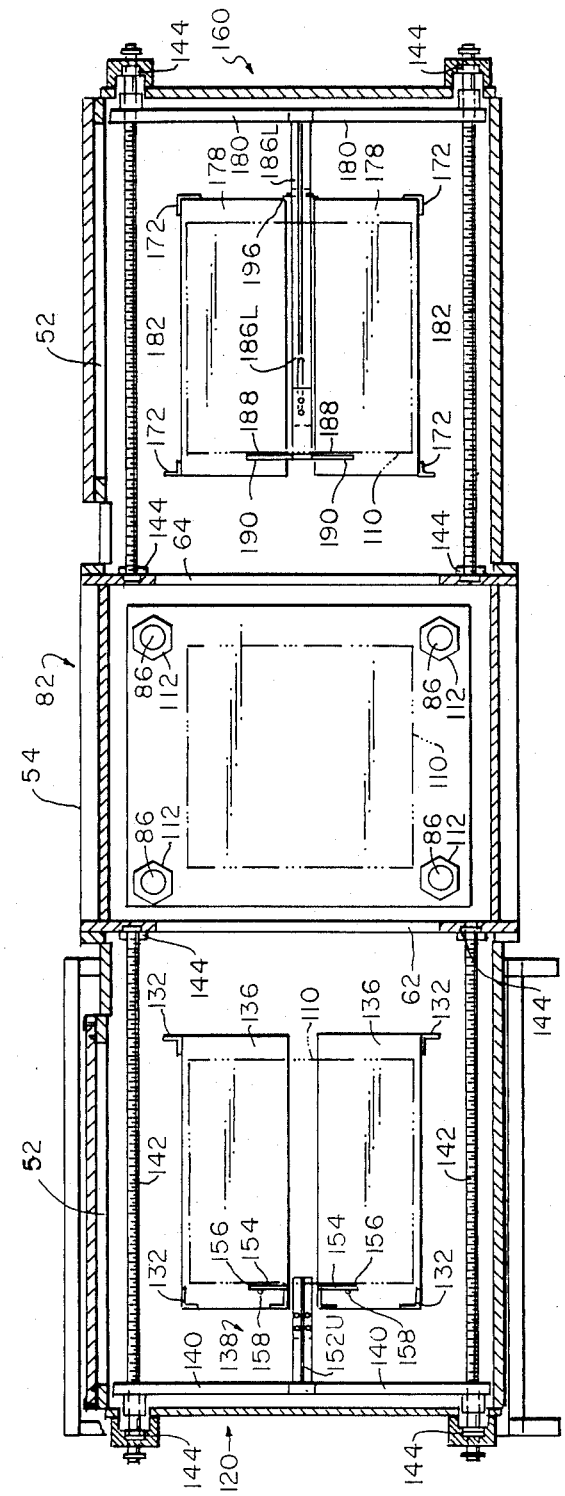
FIG. 6 is an interior top view of the chambers of FIG. 5.

Referring to FIGS. 4-6, another embodiment of the apparatus 50 of the invention comprises a multi-chambered system 50 comprising a loading chamber 52, a press chamber 54, and an unloading chamber 56 serially connected together by means of input intermediate wall 58 and output intermediate wall 60. Upper and lower openings 62 and 64 are provided in the input and output intermediate walls 58 and 60 and are provided with doors 66 and 68, respectively. Likewise, upper and lower openings 70 and 72 are provided in one of the exterior walls 74 and 76 (such as the front walls) of the loading and unloading chambers 52 and 56, respectively. Openings 70 and 72 are also provided with doors 78 and 80, respectively. Each of the doors 66, 68, 78 and 88 comprise a door member D hinged relative to the respective walls (58, 60, 74 and 76) by means of hinge-pin P, brackets B and intermediate link L. Each hinge-pin P is rotated by means of a rotary actuator M to individually open and close the doors 66, 68, 78 and 80. The rotary actuators M are powered by a suitable air supply and controller (not shown). Further, each of the doors 66, 68, 78 and 80 are provided with an O-ring seal S to assure air-tight seal with the respective walls 58, 60, 74 and 76 when closed.

Referring to FIG. 5, a hydraulic press 82 is positioned within the press chamber 54. The hydraulic press 82 comprises an upper fixed platen 84U and a middle and lower vertically movable platens 84M and 84L. The platens 84 are positioned about four guide post 86 rigidly affixed to the base 88 of the press chamber 54. The middle and lower platens 84M and 84L are slidably positioned about the guide post 86 and are supported in their spaced apart position relative to each other and the upper platen 84L by means of a middle stop 90 and a lower stop 92, respectively.

A hydraulic cylinder 94 having a shaft 96 is supported from the underside of the base 88 by means of a depending base weldment 98. Shaft 96 is operatively connected to a platen weldment 100 by means of an interconnecting rod 102. A pair of caps 104 and 106 are positioned about the rod 102 above and below the base 84. Caps 104 and 106 include O-ring seals or the like to create an air-tight seal between the rod 102 as it slides through the base 88.

The platen weldment 100 is rigidly affixed to the base 84L by threaded fasteners 88 or the like. During pressurization of the hydraulic cylinder 94, shaft 96 and rod 102 are forced therefrom causing the platen weldment 100 to move upwardly. Having previously placed printed circuit board books 110 into the space between the platens 84, continued upward movement of the platen weldment 100 forces the lower platen 84L against the middle platen 84M with the book 110 sandwiched therebetween. Still further upward movement of the platen weldment 100 forces the lower and middle platens 84L and 84M against the upper platen 84L with its book 110 sandwiched therebetween. Four threaded nuts 112 threadably engages the terminal ends of the guide posts 86 to present any upward movement of the upper platen 84U.

The hydraulic press 82 may be operated manually or by computer control. Further, each of the platens 84 may be provided with a heat source, generally indicated by numeral 114 such as electrically resistive, oil or steam heating. The heat source 114 may also be manually or computer controlled to regulate the temperature of each platen 84 during the lamination process. Finally, it is again noted that all of the walls of the press chamber 54 are air-tight to allow the operation of the press to occur in a vacuum. In such a vacuum, ambiant heat loss from the heated platens 84 is almost completely eliminated due to the lack of a heat transfer medium such as air.

An input transport system, generally indicated by the numeral 120, is positioned within the loading chamber 52. The input transfer system 120 functions to transport the books 110 through opening 62 in the press chamber's 54 input intermediate wall 58 and then onto the lower and middle platens 84. In the preferred embodiment illustrated, the input transfer system 120 comprises a lower table 122 supported from the floor 124 of the loading chamber 52 by means of corner brackets 126. Similarly, an upper table 128 is supported from the ceiling 130 of the loading chamber 52 by means of depending corner brackets 132. A slides 134 and 136 are respectively positioned on the tables 122 and 128 by means of ball transfers (not shown) which allow the slides 134 and 136 to be slid toward the lower and upper platens 84 of the hydraulic press 82 through openings 62. Hence, slides 134 and 136 function to bridge the gap between the right sides of the tables 122 and 128 and the left edge of the lower and upper platens 84L and 84U.

The input transfer system 120 further comprises a pusher assembly, generally indicated by numeral 138, which functions to push the books 110 positioned on the slides 134 and 136, and the slides themselves, from within the loading chamber 52 into the press chamber 54 thereby causing the books 110 to be positioned on the platens 84. More specifically, pusher assembly 138 comprises a cross-member 140 movable across the interior width of the loading chamber 52 by means of a pair of threaded stocks 142 journalded to the opposing sides of the loading chamber 52 by means of bearings 144. The threaded stocks 142 extend through the left wall of the loading chamber 52 and are sprocketed to be driven by chain 146 and drive motor 148. An idler sprocketed pulley 150 may be provided to maintain tension in the chain 146. The drive motor 148 may be manually or computer controlled to move the cross member 140 back and forth across the interior width of the loading chamber 52.

The pusher assembly 138 still further comprises an upper and lower loading fence 152U and 152L rigidly affixed to the cross member 140. Each fence 152 includes transversely extending arms 154, each having a downwardly depending extension 156. The arms and extensions 154 and 156 are configured to engage the left end of the books 110 placed upon the slides 134 and 136.

During use, drive motor 148 is actuated to move the pusher assembly 138 from the left to the right of the loading chamber 52. During such movement, extensions 156 engage the left ends of the books 110 and the books 110, together with the respective slides 134 and 136, are moved rightwardly until the slides 134 and 136 engage the left end of the platens 84 of the hydraulic press 82. Since the slides 134 and 136 are no longer free to move rightwardly, the books 110 are simply pushed off of the slides 134 and 136 onto the respective platens 84. Reverse operation of a drive motor 148 retracts the pusher assembly 138 from within the press chamber 54 to its original position in the loading chamber 52. Concurrently, downwardly extending extensions 156 engage respective pins 158 affixed to the slides 134 and 136 to return the slides 134 and 136 to their original position on top of the respective tables 122 and 128. Additional books 110 may then be placed on the slides 134 and 136 to repeat the process.

An output transfer system, generally indicated by the numeral 160, is provided for transferring the treated books 110 from within the press chamber 54 into the unloading chamber 56 for unloading. The output transfer system 160 is similar to the input transfer system 120 and includes lower and upper tables 162 and 164 supported from the floor 166 and the ceiling 168 of the unloading chamber 56 by means of suitable brackets 170 and 172, respectively. A slide 176 and 178 is slightably affixed to its respective table 162 and 164 to bridge the gap between the left edge of the table 162 and 164 with the right edge of the lower and middle platens 84L and 84M.

The output transfer system 160 further comprises a puller assembly, generally indicated by numeral 178 to engage and pull the books 110 from within the press chamber 54 into the unloading chamber 56. The puller assembly 178 similarly includes a cross-member 180 operatively connected to a pair of threaded stocks 182 journaled to the opposing sides of the unloading chamber 56 by means of bearings 184. Threaded stocks 182 are driven by a similarly connected drive motor and chain assembly 183. Still further similar to the input transfer system 120, the output transfer system 160 comprises a lower and upper fence 186L and 186U rigidly connected to the cross-member 180. A pair of arms 188 extend transversly from each of the fences 186 and include a downwardly depending extension 190. However, unlike the input transfer system 120, the extensions 190 of the output transfer system 160 are hinged by means of hinge-pin 192 to permit upward movement of the extension 190 in the direction of retraction of the puller assembly 178 as shown by arrow 194. This arrangement allows the extensions 190 to pivot upwardly in a position substantially parallel to the arms 188 such that the arms 188 can move over the books 110 positioned in the press chamber 54. Then, as the extensions 190 move past the left edge of the books 110, extensions 190 fall downwardly to engage the left edge of the books 110 and pull the books 110 from within the press chamber 54 upon retraction of the puller assembly 178.

It is noted that means must be provided to slide the slides 174 and 176 from the tables 162 and 164 to abut against the right edge of the lower and middle platens 84L and 84M and then securing the slides 174 and 176 in such a position until the puller assembly 178 pulls the books 110 from the press chamber 54 fully onto the slides 174 and 176. While many embodiments are feasible, one such embodiment of such means comprises a spring-loaded extension 196 depending from the respective arms 188 in line with the right edge of the slides 174 and 176. Upon extension of the puller assember 178 in the direction of the press chamber 54, extension 196 engages the right edge of the slides 174 and 176 pushes the slides 174 and 176 until they butt against the right edge of the lower and middle platens 84L and 84M, respectively. Further leftward movement of the puller assembly 178 overcomes the force of the spring-loaded extension 196 thereby forcing the extensions 196 to a retracted position to allow full extension of the puller assembly 178 into the press chamber 54. Concurrently, a spring-loaded catch 198 engages the right edge of the slides 174 and 176 to resiliently secure the slides 174 and 176 in abutment against the platens 84. The tension exerted against the brackets 170 and 172 by the spring-loaded catch 198 is sufficient to secure the slides 174 and 176 in their abutting positions while the puller assembly 178 engages the books 110 on the platens 84 and pulls the same onto the respective slides 174 and 176. Further retraction of the puller assembly 128 overcomes the tension exerted by the catch 198 to force the books 110 and the slides 174 and 176 to the fully retracted position within the unloading chamber of 56. The books 110 may then be removed upon opening of doors 80 to complete the procedure.

It is noted that the operation of the doors 60 and 68 in conjunction with the outside doors 78 and 80 of the loading and unloading chambers 52 and 56, respectively, effectively isolates the press chamber 54 and assures that the press chamber 54 will remain evacuated as books 110 are placed in the loading chamber 52 and unloaded from the unloading chamber 56. Hence, as stated above, no significant heat loss will occur within the press chamber 54 thereby assuring repeatably accurate results in treating books 110 of printed circuit boards.

Finally, it is noted that the multi-chambered system 50 of the invention may be supported above the ground by suitable stand, generally indicated by the numeral 200, with all of the support components, such as vacuum pumps, hydraulic pumps and control panels being positioned therein. Further, it is noted that the entire system 50 may be covered with an estatically pleasing metal skin with appropriate openings for doors 78 and 80 in the control panels and the control panel.

Figure 7:
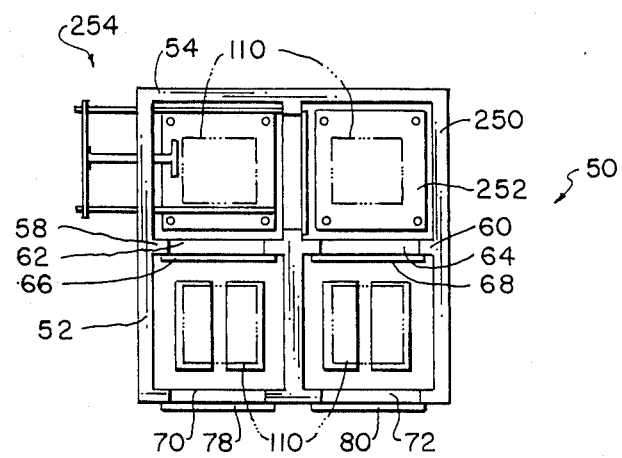
FIG. 7 is a diagrammatical view of an alternative embodiment of the apparatus of the invention as incorporating another press chamber containing another hydraulic press.

Referring now to FIG. 7, the multi-chambered system 50 of the invention may further include an additional press chamber 250 interconnected between the first press chamber 54 and the unloading chamber 56. The second press chamber 250 comprises a hydraulic press 252 of the same character as the hydraulic press 82 of the first press chamber 52, but without any means to heat the platens thereof. Hence, the second hydraulic press 252 in the second press chamber 250 functions as a cold press to cool the books 110 received from the first (heated) press chamber 54 while maintaining pressure on the books 110 during final curing of the epoxy layers of the printed circuit boards thereof. However, both press chambers 54 and 250 remain isolated from atmospheric conditions and contaminants by means of the loading and unloading chambers 52 and 56. Finally, it is also noted that an additional transfer system, generally indicated by the numeral 254 is required to transfer the books 110 from the first press chamber 54 into the second press chamber 250. This additional transfer system 254 may either comprise a pusher assembly, generally indicated by numeral 256, similar to the pusher assembly 138 of the input transfer system 120. Alternatively, the transfer system 254 may comprise a puller assembly (not shown) similar to that of the puller assembly 178 of the output transfer system 160. Finally, the transfer system 254 may include a retractable slide (not shown) to bridge the distance between the platens of the first press chamber 54 with those of the second press chamber 250 allowing the books 110 to be transported from the first press chamber 54 to the second press chamber 250.

Figure 8:
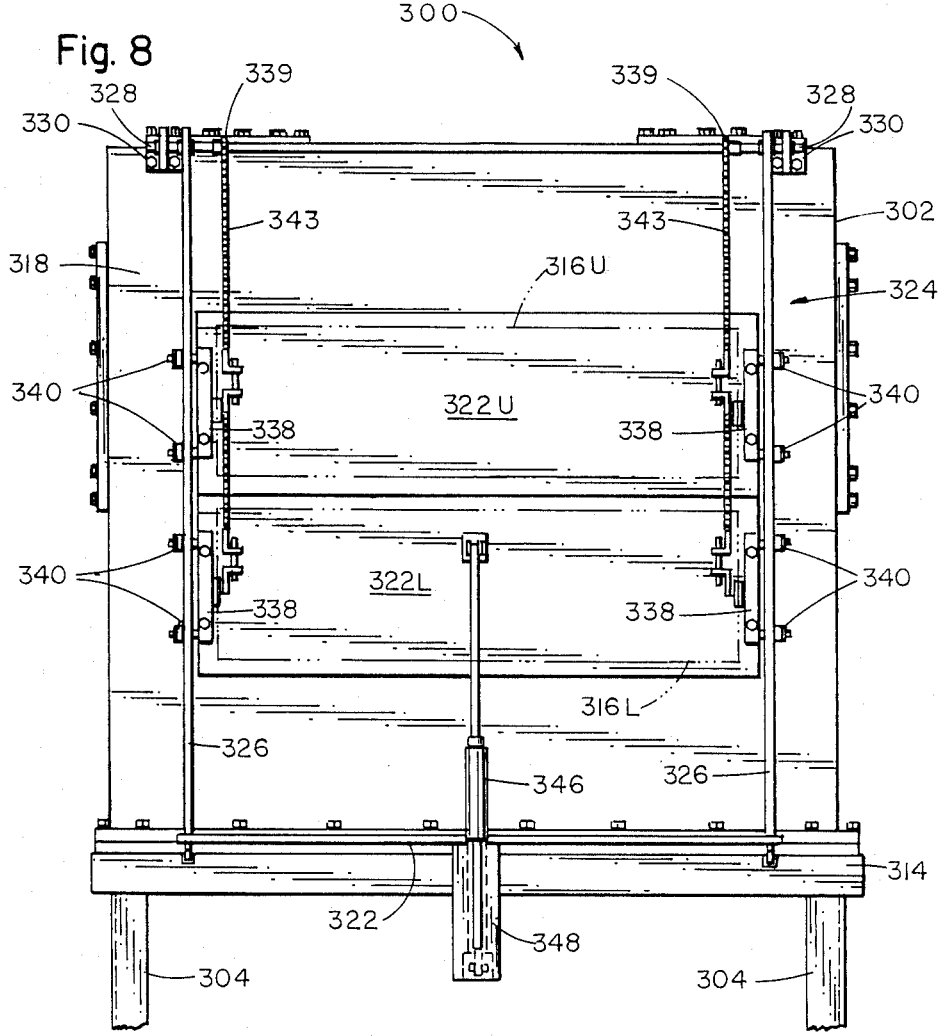
FIG. 8 is a front view of the third embodiment of the apparatus of the invention comprising a vacuum chamber including a hydraulic press having a plurality of platen assemblies for simultaneously treating a plurality of printed circuit board books.
Figure 9:
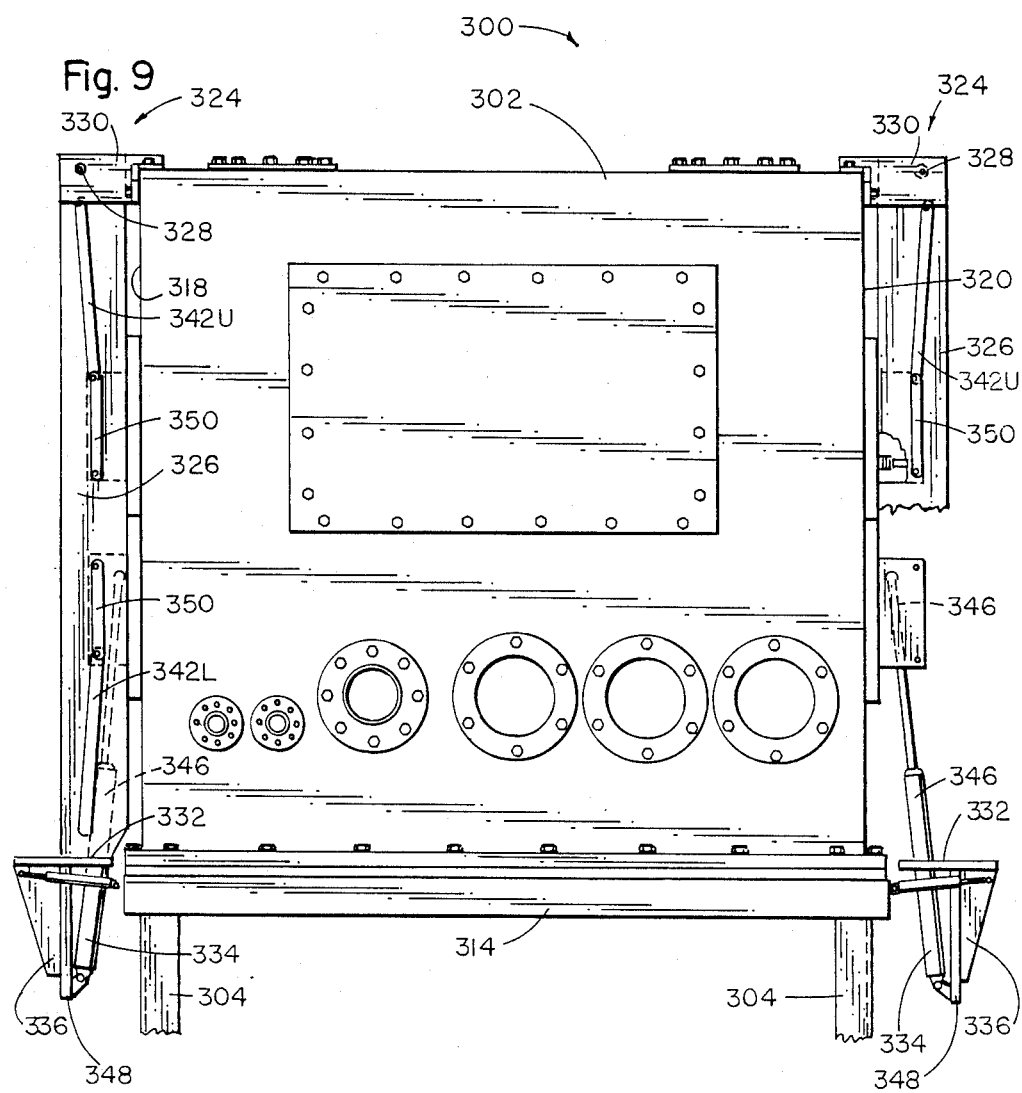
FIG. 9 is a side view of FIG. 8, illustrating in more detail, the structure of the doors to the vacuum chamber.

Referring to FIGS. 8 and 9, the third embodiment of the apparatus 300 of the invention comprises a generally rectangular vacuum chamber 302 supported by a generally rectangular base 304. The apparatus 300 further includes a hydraulic press, generally indicated by numeral 306 comprising one or more hydraulic cylinders 308 (four are shown) which are supported within base 304 by means of support bracket 310. Each hydraulic cylinder 308 includes a shaft 312 which extends through the bottom 314 of the vacuum chamber 302. Seals are provided to allow each shaft 312 to reciprocatibly move through the bottom 314 of the chamber 302 while maintaining an airtight seal therewith.

Upper and lower openings 316U and 316L are provided at the front 318 and rear 320 of the vacuum chamber 302 to allow printed circuit board books to be loaded into and unloaded from the vacuum chamber 302. Upper and lower doors 322U and 322L are provided for the upper and lower openings 316U and 316L, respectively, to form an airtight seal therewith. Means are provided to open such doors 322 to gain access to the vacuum chamber 302.

In a preferred embodiment, operation of the doors 322 from the front 318 or rear 320 operate simultaneously by means of a track mechanism, generally indicated by numeral 324.

More particularly, track mechanism 324 comprises pair of tracks 326 positioned on opposing sides of the openings 316. The upper portion of each track 326 is pivotably connected at pivot point 328 to the upper edge of the vacuum chamber 302 by means of bracket 330. The lower ends of tracks 326 are connected by a horizontal crossmember 332. Pneumatic cylinders 334 are operatively connected between the lower edge of the vacuum chamber 302 to crossmember 332 at opposing sides thereof by means of brackets 336. Extension of the pneumatic cylinders 334 cause the tracks 326 to pivot about pivot point 328 away from the vacuum chamber 302. The upper and lower doors 322U and 322L are fitted at their opposing sides with a roller bracket 338 having rollers 340 which slidably engage within upper and lower slots 342U and 342L formed within the tracks 326. A pair of chains 343 are respectively connected to the roller brackets 338 of the lower door 322L over a pair of sprockets 339 disposed at the upper edge of the vacuum chamber 302 to the roller brackets 338 of the upper door 322U. A pneumatic cylinder 346 is pivotably connected between the lower door 322L and a bracket 348 mounted to crossmember 332.

During operation, actuation of pneumatic cylinders 344 forces tracks 322 outwardly to break the seal of the doors 322 with their respective openings 316. Pneumatic cylinder 346 is then operated to pull the lower door 322L downwardly which causes the upper door 322L to move upwardly via chain 343. The vacuum chamber 302 may then be loaded or unloaded with the printed circuit board books. Closure of the doors 322 is accomplished by operating pneumatic cylinder 346 to cause the doors 322 to move together in front of the respective openings 316 whereupon pneumatic cylinders 334 are operated to move the tracks 326 toward the vacuum chamber 302 until the doors 322 seal about their respective openings 316. It is noted that the tracks 326 include portion 350 which is parallel to the face of the vacuum chamber 302 to assure that the doors 322 properly seal against the respective openings 316.

Figure 10:
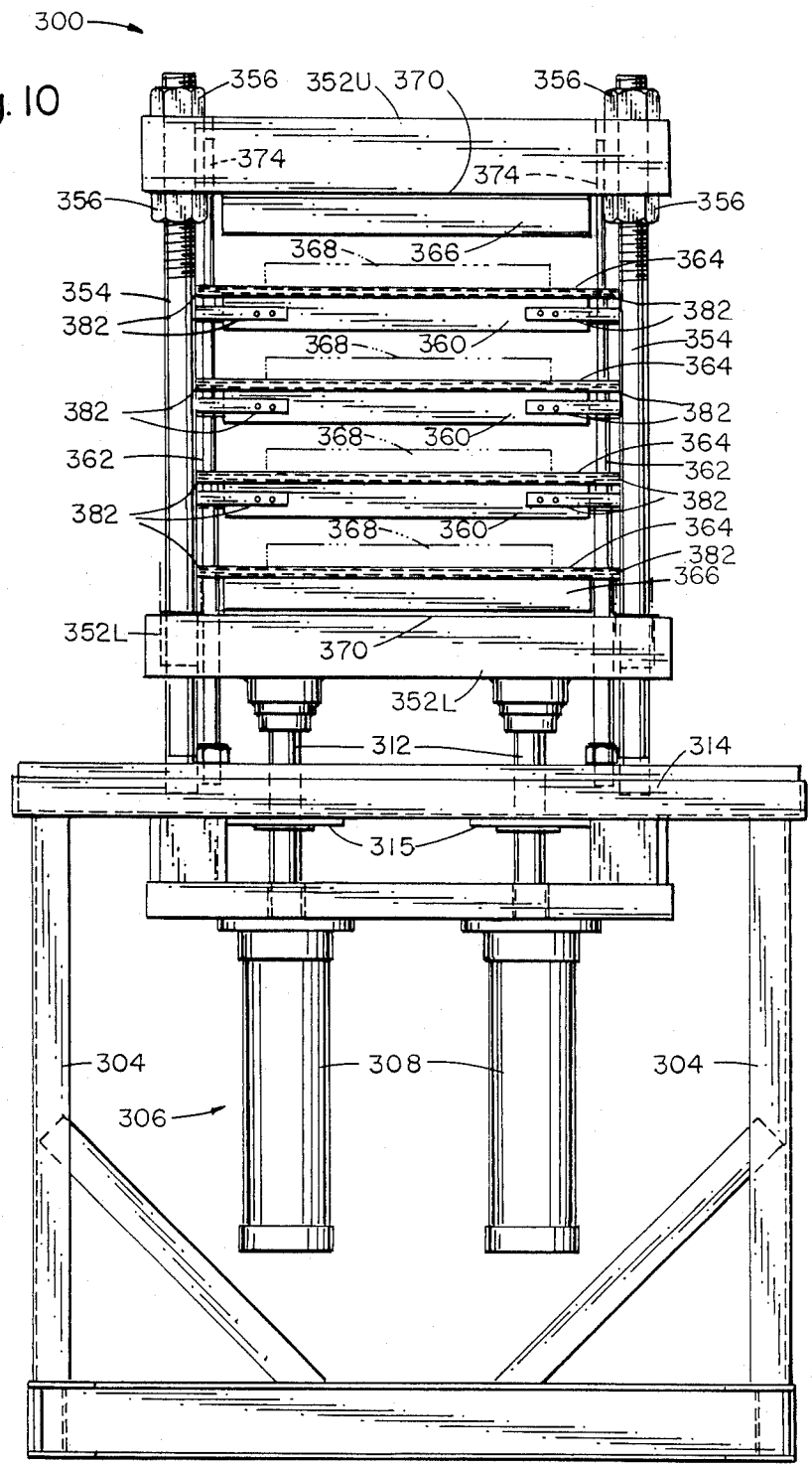
FIG. 10 is an enlarged front view of the vacuum chamber of the invention, partially in section, illustrating the plurality of platen assemblies therein.

Referring to FIG. 10, the hydraulic press 306 further includes a fixed upper bolster plate 352U mounted to the upper end of four standing guide posts 354 by means of threaded nuts 356. The hydraulic press 306 further includes a lower bolster plate 352L reciprocatibly mounted to the guide posts 354 by graphite bearings or the like allowing the lower bolster plate 352 to slide upwardly and downwardly about the guide posts 354. The shafts 312 of hydraulic cylinders 308 are rigidly connected to the underside of the lower bolster plate 352L to be moved upwardly and downwardly thereby. A plurality of platen assemblies, generally indicated by numeral 306, are positioned between the upper and lower bolster plates 352U and 352L by means of four upstanding guide shafts 362. Preferably, each platen assembly 360 comprises a bookshelf 364 on which is placed a printed circuit board book 368 and a chamber platen 366 which is heated and cooled to activate and cure the adhesive layers in the book 368. An uppermost chamber platen 366 is rigidly secured to the underside of the upper bolster plate 352U and thermally insulated therefrom by means of insulation sheet 370 or the like. Likewise, the chamber platen 366 of the lowermost platen assembly 360 is secured to the upper surface of the lower bolster plate 352L and insulated therefrom by means of insulation sheet 370.

Figure 11:
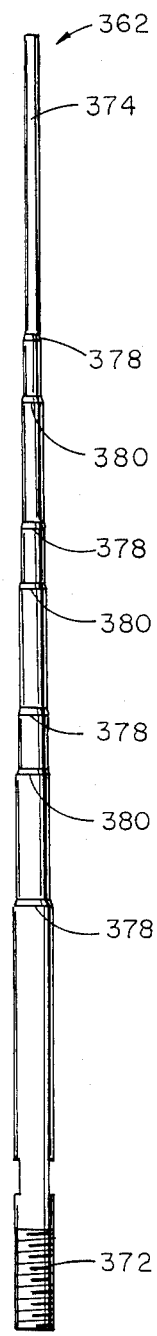
FIG. 11 is an enlarged view of one of the platen assembly guide shafts having a stepped configuration for spacing each bookshelf apart from its chamber platen of each platen assembly and for spacing the plurality of platen assemblies apart from one another.

Referring to FIG. 11, each guide shaft 362 comprises a progressively narrower stepped configuration for retaining the respective bookshelves 364 and chamber platens 366 in a spaced-apart manner while allowing the same to be moved upwardly to compress the books 368 positioned on the respective bookshelves 364. Specifically, each guide shaft 362 includes a lower threaded end 372 which threadably engages the bottom 314 of the vacuum chamber 302. The upper end 374 is positioned within a corresponding hole 376 positioned in the upper bolster plate 352U.

In its most preferred embodiment, each guide shaft 362 includes a lowermost bookshelf step 378 for supporting the lowermost bookshelf 364 and three matched pairs of a chamber platen step 380 and a bookshelf step 378 for supporting the three uppermost platen assemblies 360. It is noted that each chamber platen 366 and bookshelf 364 rest upon its respective step 380 or 378 respectively, by means of an appropriately dimensioned corner support 382 having a properly dimensioned hole therethrough to rest upon the chamfered edge of the respective steps 378, 380. Indeed, it shall be understood that the supports 382 not only support the respective chamber platens 366 and bookshelves 364, but also allow the same to be moved upwardly during upward movement of the lower bolster plate 352L.

Figure 12:
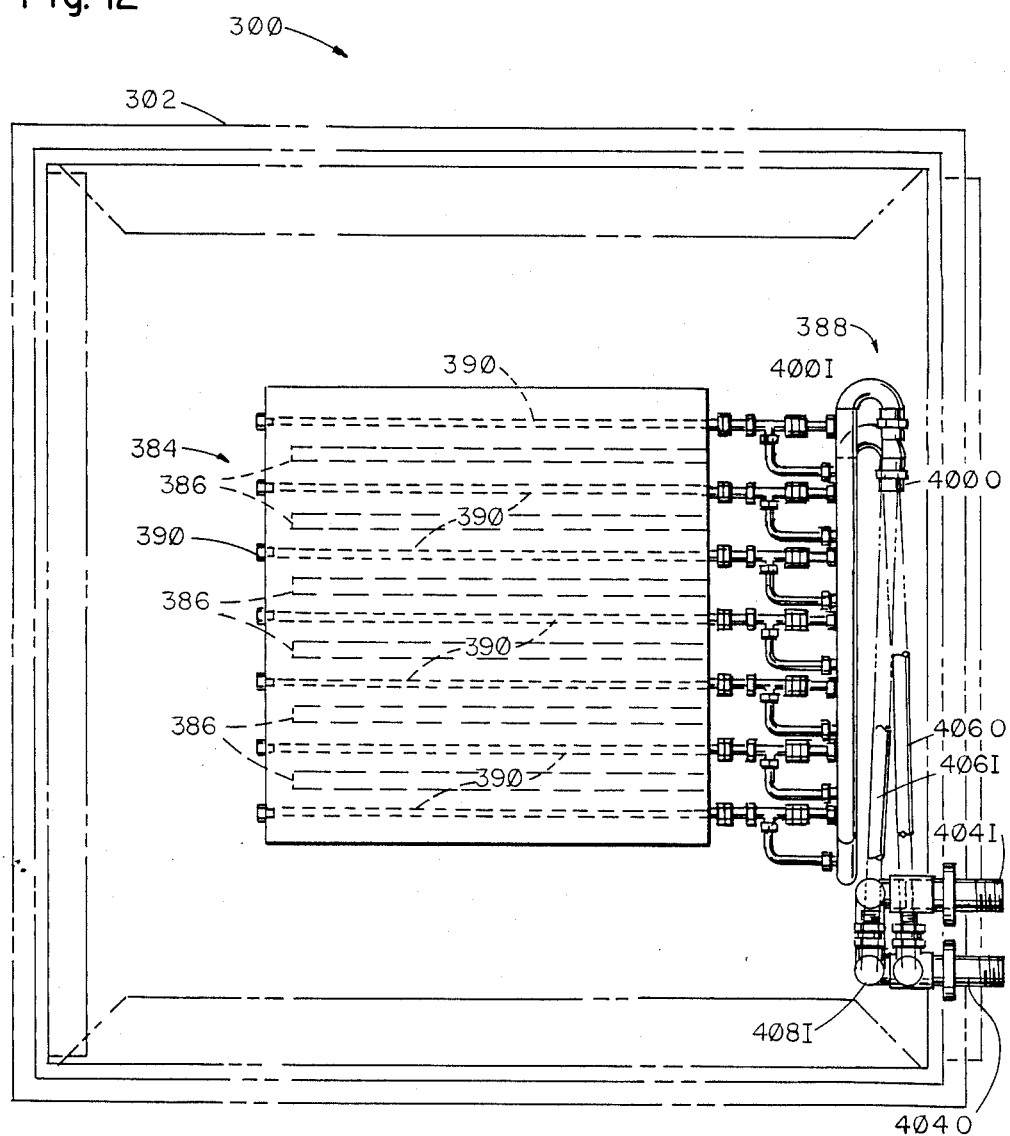
FIG. 12 is a plan view of the cooling system of the invention for cooling the chamber platens of the platen assemblies while allowing the same to travel upwardly and downwardly on the guide shafts within the chamber.

As noted earlier, means are provided for heating and cooling the chamber platens 366. As shown in FIG. 12, the heating means 384 comprises a plurality of cartridge heaters 386 mounted in respective longitudinal holes in each of the chamber platens 366. The cooling means, generally indicated by numeral 388, comprises a plurality of tube in tube heat exchangers 390 which are positioned in longitudinal holes in each of the chamber platens 366. An input and output J-shaped manifolds 400I and 400O are rigidly connected to the chamber platen 366 by means of brackets 402. The input J-shaped manifold 400I includes a plurality of ports for connection to the inside tube of the tube in tube heat exchanger 390. Likewise, the output J-shaped manifold 400O includes plurality of ports for connection to the outside tube of the tube in tube heat exchanger 390. Both of the manifolds 400I and 400O are connected to input and output conduits 404I and 404O positioned through the wall of the vacuum chamber 302 by means of flexible tubing 406I and 406O and swivel connectors 408I and 408O. Preferably, the heating and cooling means 384 and 386 are alternatively positioned within each chamber platen 366 to provide uniform heating and cooling during use.

During operation, doors 322U and 322L are opened in the manner described above. A printed circuit board book 368 is then placed upon each bookshelf 364. Doors 322U and 322L are then closed to form an airtight vacuum chamber 302. A vacuum pump (not shown) is then operated to evacuate the chamber 302. Upon evacuation, heating means 384 is actuated to heat the chamber platens 366. However, it is noted that conductive heat transfer to the respective bookshelves 364 is precluded because the chamber platens 366 are separated from their respective bookshelves 364. Hydraulic cylinders 308 are then operated to force the lower bolster plate 352L upwardly whereupon the lowermost chamber platen 366 engages against the underside of the lowermost bookshelf 364 of the first book assembly 360. Further upward movement then causes the book 368 positioned on the lowermost bookshelf 364 to engage against the underside of the next lowermost chamber platen 366 causing it to engage against its bookshelf 364. This process continues as the lower bolster plate 352L moves upwardly until the printed circuit board books 368 are sandwiched between adjacent bookassemblies 360. A desired pressure is applied during activation and curing of the adhesive layer in the books 368. After preselected periods of time, cooling means 388 is operated to circulate a cooling fluid through the heat exchangers 390 to cool the chamber platens 366 while maintaining pressure on the books 368. After appropriate cooling the bolster plate 352L is lowered allowing the respective bookshelves 364 and chamber 366 to sequentially be seated upon their respective steps 378 and 380 of the guide shafts 362. Doors 322U and 322L may then be opened at the rear 320 of the vacuum chamber 302 allowing removal of the books 368. The process may then be repeated.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and sequence of parts may be resorted to without departing from the spirit of the invention.

Now that the invention has been described,
What is claimed is:

1. An apparatus for laminating the layers of a book composed of printed circuit layers and adhesive layers, comprising in combination:
   a vacuum chamber including an opening;
   door means affixed about said opening, said door means comprising means for forming an airtight seal about said opening;
   a press having an upper and a lower bolster plate, said bolster plates being positioned within said vacuum chamber;
   a first platen assembly including a bookshelf and a chamber platen; and
   means for positioning said bookshelf apart from said chamber platen of said platen assembly between said bolster plates until actuation of said press whereupon said bookshelf and said chamber platen engage one another between said bolster plates.

2. The apparatus as set forth in claim 1, further including a second chamber platen positioned between said platen assembly and said upper bolster plate.

3. The apparatus as set forth in claim 2, further including means for heating said chamber platens.

4. The apparatus as set forth in claim 2, further including means for cooling said chamber platens.

5. The apparatus as set forth in claim 1, wherein said means for positioning said bookshelf and said chamber platen of said first platen assembly comprises a stepped guide shaft including a lower step for supporting said chamber platen and a higher, smaller diameter step for supporting said bookshelf, allowing said lower bolster plate to move said chamber platen upwardly to engage said bookshelf and move said bookshelf and said chamber platen further upwardly to press the book positioned thereon against said second chamber plates.

6. The apparatus as set forth in claim 5, wherein said first platen assembly is substantially rectangularly shaped and wherein one of said guide shafts is positioned in each corner of said first platen assembly.

7. The apparatus as set forth in claim 6, further including a second platen assembly positioned between said first platen assembly and said second bolster plate.

* * * * *